(12) United States Patent
Hsu et al.

(10) Patent No.: US 10,680,120 B2
(45) Date of Patent: Jun. 9, 2020

(54) SEMICONDUCTOR DEVICE AND METHOD FOR MANUFACTURING THE SAME

(71) Applicant: Vanguard International Semiconductor Corporation, Hsinchu (TW)

(72) Inventors: Ching-Yi Hsu, Hsinchu (TW); Shih-Hao Liu, Taoyuan (TW); Wu-Hsi Lu, New Taipei (TW); Yun-Chou Wei, Taipei (TW); Chih-Cherng Liao, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/945,822

(22) Filed: Apr. 5, 2018

(65) Prior Publication Data
US 2019/0312154 A1   Oct. 10, 2019

(51) Int. Cl.
H01L 29/06 (2006.01)
H01L 29/94 (2006.01)
H01L 29/66 (2006.01)

(52) U.S. Cl.
CPC .......... *H01L 29/94* (2013.01); *H01L 29/0649* (2013.01); *H01L 29/66181* (2013.01)

(58) Field of Classification Search
CPC .......... H01L 21/28282; H01L 23/5223; H01L 29/94; H01L 29/66181; H01L 29/0649;
(Continued)

(56) References Cited

U.S. PATENT DOCUMENTS 6,064,589 A * 5/2000 Walker .................. G11C 11/404
257/296
2001/0042879 A1 11/2001 Ghilardelli et al.
(Continued)

FOREIGN PATENT DOCUMENTS

TW   200418194 A   9/2004
TW   201347192 A   11/2013

OTHER PUBLICATIONS

Taiwanese Office Action and Search Report dated Jul. 25, 2018, for Taiwanese Application No. 106134340.
(Continued)

*Primary Examiner* — Robert G Bachner
(74) *Attorney, Agent, or Firm* — Birch, Stewart, Kolasch & Birch, LLP

(57) ABSTRACT

A semiconductor device includes a substrate, a well region formed in the substrate, first and second isolation regions formed in the substrate, a dielectric layer formed on the well region, a conductive layer formed on the dielectric layer, a first doped region, an insulating layer, and first and second contact vias. The dielectric layer is disposed between the first and second isolation regions. The first doped region is formed in the well region. The insulating layer is formed on the dielectric layer, the first and second isolation regions, and the first doped region. The first contact via is formed in the insulating layer and electrically connected to the conductive layer. The first contact via is disposed on an overlapping area between the dielectric layer and the conductive layer. The second contact via is formed in the insulating layer and electrically connected to the doped region.

20 Claims, 10 Drawing Sheets

(58) Field of Classification Search
CPC ............... H01L 27/088; H01L 27/0255; H01L 21/823878
See application file for complete search history.

(56) References Cited

U.S. PATENT DOCUMENTS

| | | | |
|---|---|---|---|
| 2004/0263269 A1 | 12/2004 | Takamatsu | |
| 2006/0033139 A1* | 2/2006 | Masuoka | H01L 27/0629 257/296 |
| 2006/0240627 A1* | 10/2006 | Inoue | H01L 21/823412 438/289 |
| 2007/0246790 A1 | 10/2007 | Zinn et al. | |
| 2008/0017906 A1 | 1/2008 | Pelella et al. | |
| 2008/0157158 A1* | 7/2008 | Ahn | H01L 27/0629 257/306 |
| 2010/0244113 A1 | 9/2010 | Rieh et al. | |
| 2012/0043595 A1* | 2/2012 | Chang | H01L 23/5223 257/296 |
| 2013/0089963 A1 | 4/2013 | Mishima et al. | |
| 2013/0113078 A1* | 5/2013 | Liu | H01L 29/66181 257/532 |
| 2013/0181270 A1* | 7/2013 | Ishitsuka | H01L 27/0629 257/296 |
| 2015/0067492 A1 | 3/2015 | Ozaki et al. | |

OTHER PUBLICATIONS

Taiwanese Office Action and Search Report, dated Apr. 16, 2018, for Taiwanese Application No. 106134340.

* cited by examiner

SEMICONDUCTOR DEVICE AND METHOD FOR MANUFACTURING THE SAME

BACKGROUND OF THE INVENTION

Field of the Invention

The invention relates to a semiconductor device, and more particularly to a method for manufacturing a semiconductor device for forming a capacitor.

Description of the Related Art

As an increasing demand for integrated circuits with reduced sizes, sizes of components therein need to be reduced accordingly. In addition, the configuration of the components on the circuit substrates needs to be adjusted accordingly. For example, if the distance between the components can be shortened, the size of the integrated circuits can be reduced effectively

BRIEF SUMMARY OF THE INVENTION

An exemplary embodiment of a semiconductor device is provided. The semiconductor device comprises a substrate, a well region, a first isolation region, a second isolation region, a dielectric layer, a conductive layer, a first doped region, an insulating layer, a first contact via, and a second contact via. The well region is formed in the substrate. The first isolation region and a second isolation region are formed in the substrate. The dielectric layer is formed on the well region and disposed between the first isolation region and the second isolation region. The conductive layer is formed on the dielectric layer. The first doped region is formed in the well region. The insulating layer is formed on the dielectric layer, the first isolation region, the second isolation region, and the first doped region. The first contact via is formed in the insulating layer and electrically connected to the conductive layer. The first contact via is disposed on an overlapping area between the dielectric layer and the conductive layer. The second contact via is formed in the insulating layer and electrically connected to the doped region.

An exemplary embodiment of a method for manufacturing a semiconductor device is provided. The method comprises the following steps of provided a substrate; forming a well region in the substrate; forming a first isolation region and a second isolation region in the substrate; forming a dielectric layer on the well region between the first isolation region and the second isolation region; forming a conductive layer on the dielectric layer; forming a first doped region in the well region; forming an insulating layer formed on the dielectric layer, the first isolation region, the second isolation region, and the first doped region; forming a first contact via in the insulating layer and on an overlapping area between the dielectric layer and the conductive layer, wherein the first contact via is electrically connected to the conductive layer; and forming a second contact via in the insulating layer, wherein the second contact via is electrically connected to the doped region.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
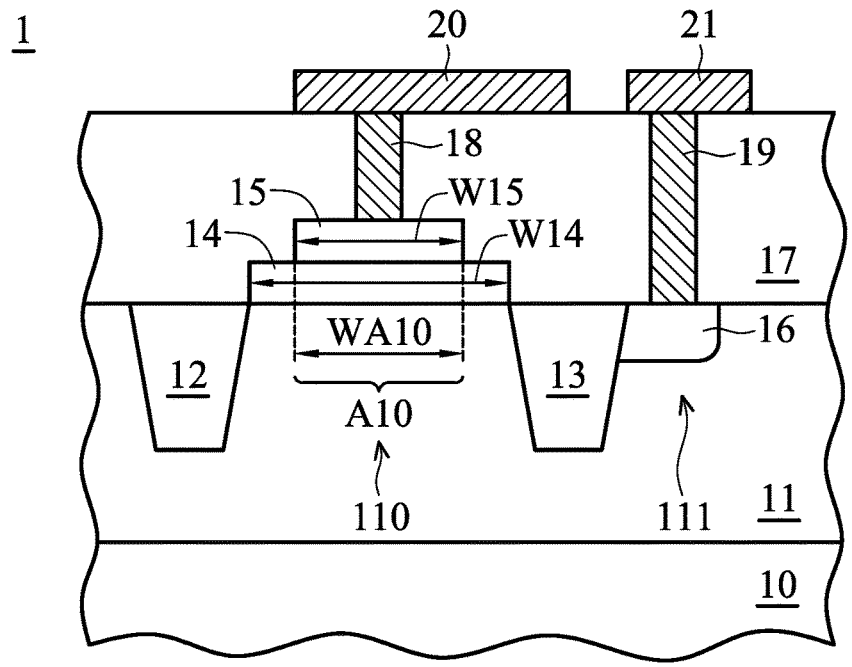
FIG. 1 is a cross-sectional view of a semiconductor device according to one exemplary embodiment.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 shows a cross-sectional view of a semiconductor device according to one exemplary embodiment of the present invention. Referring to FIG. 1, a semiconductor device 1 includes a substrate 10. A well region 11 is formed in substrate 10. In the embodiment, the conductivity type of the well region 11 is P-type. In other embodiments, the conductivity type of the well region 11 may be N-type. Isolation regions 12 and 13 are formed in the substrate 10. Isolation regions 12 and 13 may be formed by a manner related to shallow trench isolation (STI). In the cross-sectional view of FIG. 1, the isolation regions 12 and 13 are two isolation regions separated from each other. However, in other embodiments, the isolation regions 12 and 13 may be different portions of an isolation region from the top view of the semiconductor device 1. The well region 11 can be divided into areas 110 and 111 according to the positions of the isolation regions 12 and 13 in the cross-sectional view. The area 110 refers to the area of the well region 11 that is disposed on the right of the isolation region 12 and on the left of the isolation region 13, that is, the region between the isolation regions 12 and 13. The area 111 refers to the area of the well region 11 which is disposed on the right of the solation region 13.

A dielectric layer 14 is formed on the well region 11. In the embodiment, the dielectric layer 14 is formed on a portion of the well region 11 which is between the isolation regions 13 and 14, that is, on the area 110 of the well region 11. In addition, the width W14 of the dielectric layer 14 is equal to the width of the upper surface of the area 110, that is, the dielectric layer 14 fully covers the upper surface of the area 110. A conductive layer 15 is formed on the dielectric layer 14. The overlapping area between the conductive layer 15 and the dielectric layer 14 is defined as an effective capacitance area A10. Referring to FIG. 1, the width W15 of the conductive layer 15 is smaller than the width W14 of the dielectric layer 14, such that the conductive layer 15 only overlaps a portion of the dielectric layer 14. In this case, the overlapping area depends on the conductive layer 15, and therefore, the width WA10 of the effective capacitance area A10 is equal to the width W15 of the conductive layer 15. In other embodiments, referring to FIG. 2, the width W15 of the conductive layer 15 is equal to the width W14 of the dielectric layer 14, such that the conductive layer 15 completely overlaps the dielectric layer 14. Therefore, the width WA10 of the effective capacitance area A10 is equal to the width W15 of the conductive layer 15 and also equal to the width W14 of the dielectric layer 14. In other embodiments, referring to FIG. 3, the width W15 of the conductive layer 15 is greater than the width W14 of the dielectric layer 14, such that a portion of the conductive layer 15 overlaps with the dielectric layer 14. Therefore, the overlapping area depends on the dielectric layer 14, and the width WA10 of the effective capacitance area A10 of the capacitor is equal to the width W14 of the conductive layer 14.

Figure 2:
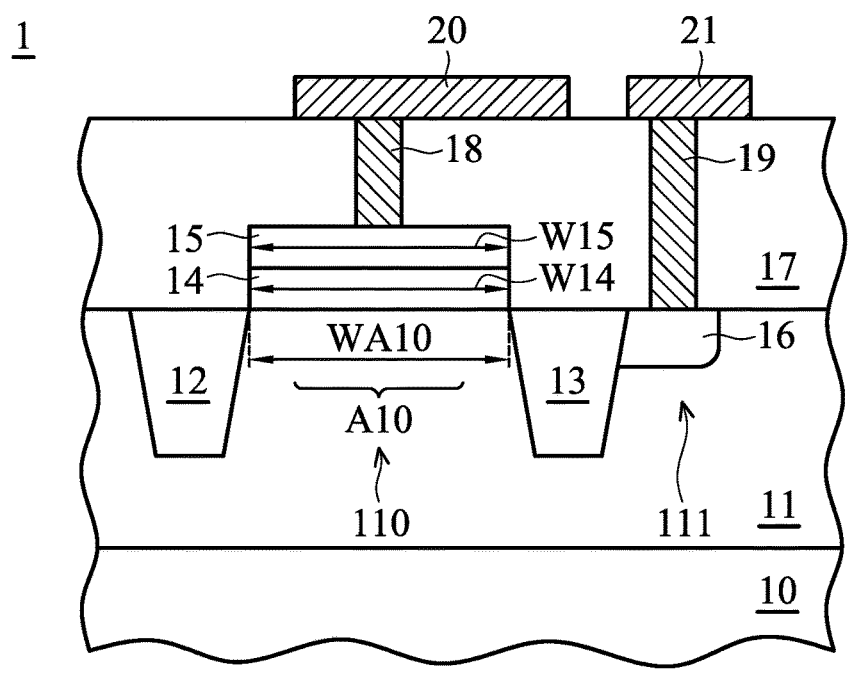
FIG. 2 is a cross-sectional view of a semiconductor device according to another exemplary embodiment.
Figure 3:
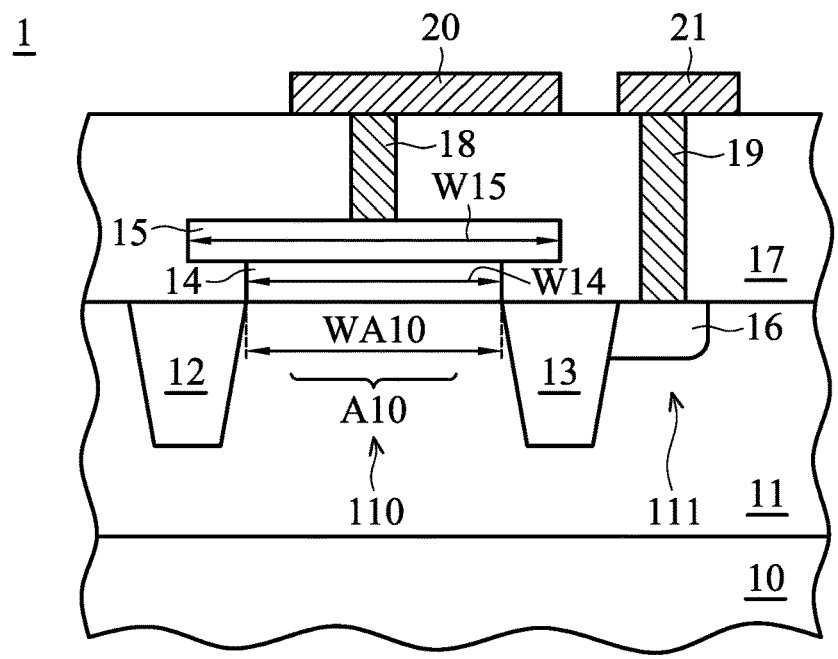
FIG. 3 is a cross-sectional view of a semiconductor device according to another exemplary embodiment.

A doped region 16 is formed in the well region 10. The doped region 16 has the same conductivity type as the well region 11. In this embodiment, the conductivity type of the doped region 16 is P-type. Referring to FIG. 1, the doped region 16 is formed in the area 111 of the well region 10. An insulating layer 17 is formed on the doped region 16, the conductive layer 15, the dielectric layer 14, and the isolation regions 12 and 13. In detail, the insulating layer 17 contacts the upper surfaces of the doped region 16, the conductive layer 15, the dielectric layer 14, and the isolation regions 12 and 13. In other embodiments, as shown in FIGS. 2 and 3, since the width W15 of the conductive layer 15 is greater than or equal to the width W14 of the dielectric layer 14, the insulating layer 17 is formed on the doped region 16, the conductive layer 15, and the isolation regions 12 and 13. The insulating layer 17 in the embodiments of FIGS. 2 and 3 does not contacts the upper surface of the dielectric layer 14 as compared with the embodiment of FIG. 1

A contact via 18 is formed in the insulating layer 17. Referring to FIG. 1, the contact via 18 is disposed on the overlapping area (that is the effective capacitance area A10) of the conductive layer 15 and the dielectric layer 14 and electrically connected to the conductive layer 15. In this embodiment, the entirety of the contact via 18 is disposed directly on the overlapping area (effective capacitance area A10) between the conductive layer 15 and the dielectric layer 14. A metal layer 20 is formed on one portion of the insulating layer 17 and covers the contact via 18, such that the conductive layer 15 may electrically connect with other devices on the substrate 10 through the contact via 18 and the metal layer 20. A contact via 19 is additionally formed on the insulating layer 17. Referring to FIG. 1, the contact via 19 is disposed on the doped region 16 and electrically connected to the doped region 16. A metal layer 21 is formed on another portion of the insulating layer 17 and covers the contact via 19, such that the doped region 16 can electrically connect with other devices on the substrate 10 through the contact via 19 and the metal layer 21.

According to the above description, the dielectric layer 14, the conductive layer 15, and the doped region 16 form a capacitor structure. As a result, the semiconductor device 1 is a capacitor device. The metal layer 20 serves as the upper electrode of the capacitor device, while the metal layer 21 serves as the lower electrode of the capacitor device. In addition, since the contact via 18 are disposed on the overlapping area between the conductive layer 15 and the dielectric layer 14, the range of the conductive layer 15 that extends from the overlapping area to the one or both sides in the insulating layer 17 may thus be reduced, thereby reducing the size of the semiconductor device 1. As a result, more semiconductor elements or devices can be disposed on the same substrate 10.

Figure 4A:
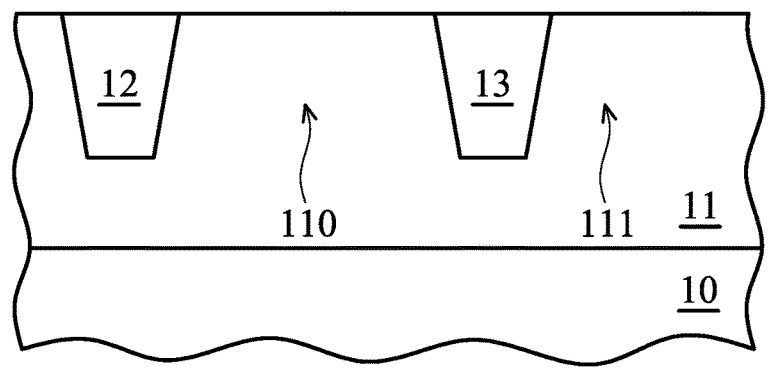
FIGS. 4A-4G show a method for manufacturing a semiconductor device according to an exemplary embodiment.

Hereinafter, the method for manufacturing the semiconductor device 1 will be described by referring to the drawings. Referring to FIG. 4A, a semiconductor substrate 10 is formed. The substrate 10 may be a silicon substrate, a silicon germanium (SiGe) substrate, or other any other appropriate semiconductor substrate. A well region 11 whose P conductivity type is P-type is formed in the substrate 10. Isolation regions 12 and 13 are formed in the substrate 10. The isolation regions 12 and 13 may be formed by a manner related to shallow trench isolation (STI). The isolation regions 12 and 13 provide an isolation barrier around the effective capacitance area A10 (shown in FIG. 1). After a planarization procedure (such as a chemical-mechanical planarization (CMP) procedure) is performed on the well region 11, the well region 11 has a plane surface The well region 11 can be divided into areas 110 and 111 according to the positions of the isolation regions 12 and 13 in the cross-sectional view. The area 110 refers to the area of the well region 11 that is disposed on the right of the isolation region 12 and on the left of the isolation region 13, that is, the region between the isolation regions 12 and 13. The area 111 refers to the area of the well region 11 which is disposed on the right of the solation region 13.

Figure 4B:
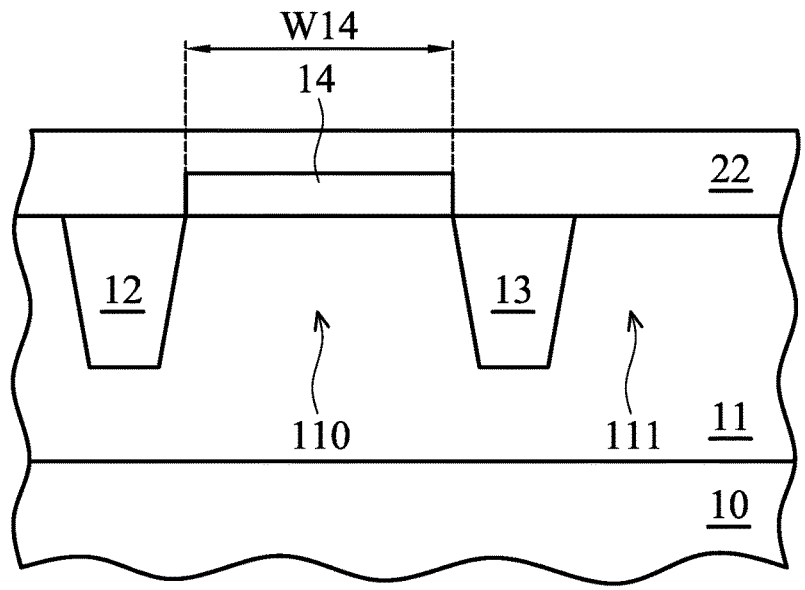
Figure 4C:
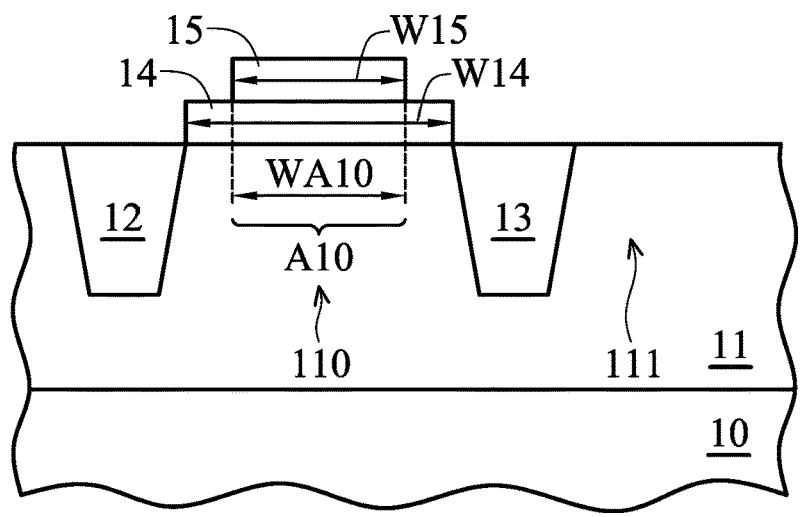

Referring to FIG. 4B, a dielectric layer 14 is formed on the plane surface of well region 11. The dielectric layer 14 may be formed by growing a thin film of silicon oxide, silicon nitride, a high dielectric constant material, or any combination thereof on the plane surface of the well region 11 between the isolation regions 13 and 14. In other words, the dielectric layer 14 is formed on a portion of the well region 11 which is between the isolation regions 13 and 14, that is, on the area 110 of the well region 11. In the FIG. 4B embodiment, the width W14 of the dielectric layer 14 is equal to the width of the upper surface of the area 110. A conductive layer 15 is formed on the dielectric layer 14. A poly-silicon layer 22 is formed on the plane surface of the well region 11 and the surface of the dielectric layer 14, and a patterning process is performed on the poly-silicon layer 22. As shown in FIG. 4C, after the poly-silicon layer 22 is patterned, the conductive layer 15 is thus formed. In one embodiment, a metal silicide is formed on the poly-silicon layer 22. The overlapping area between the conductive layer 15 and the dielectric layer 14 is defined as an effective capacitance area A10. Referring to FIG. 4C, the width W15 of the conductive layer 15 is smaller than the width W14 of the dielectric layer 14, so that the conductive layer 15 only overlaps a portion of the dielectric layer 14. Therefore, the width WA10 of the effective capacitance area A10 o defined by the overlapping area is equal to the width W15 of the conductive layer 15.

Figure 4D:
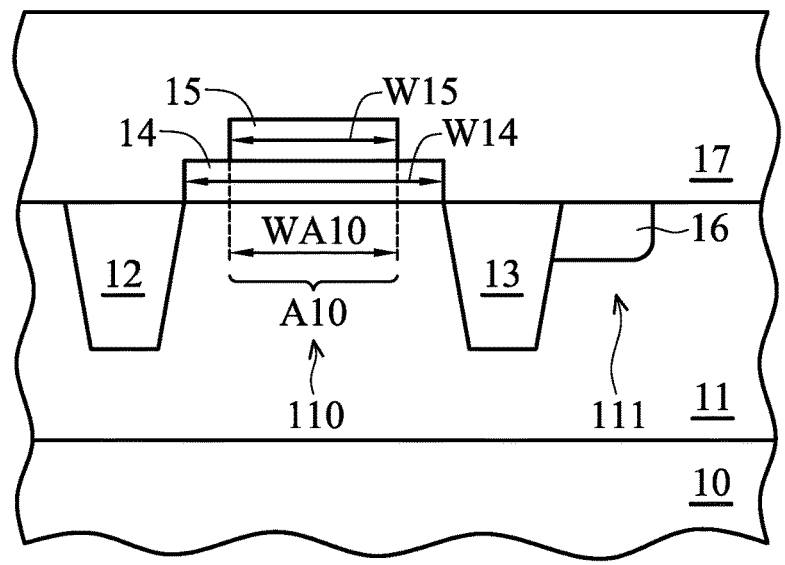

Referring to FIG. 4D, a doped region 16 is formed in the area 111 of the well region 10. The dope region 16 has the same conductivity type as well region 11, that is the P-type conductivity. An insulating layer 17 is formed on the doped region 16, the conductive layer 15, the dielectric layer 14, and the isolation regions 12 and 13. In detail, the insulating layer 17 contacts the upper surfaces of the doped region 16, the conductive layer 15, the dielectric layer 14, and the isolation regions 12 and 13. The insulating layer 17 may be formed on the substrate 10 by depositing oxide, nitride, or nitrogen oxide on the substrate 10. After a planarization procedure (such as a CMP procedure) is performed on the insulating layer 17, the insulating layer 17 has a plane surface.

Figure 4E:
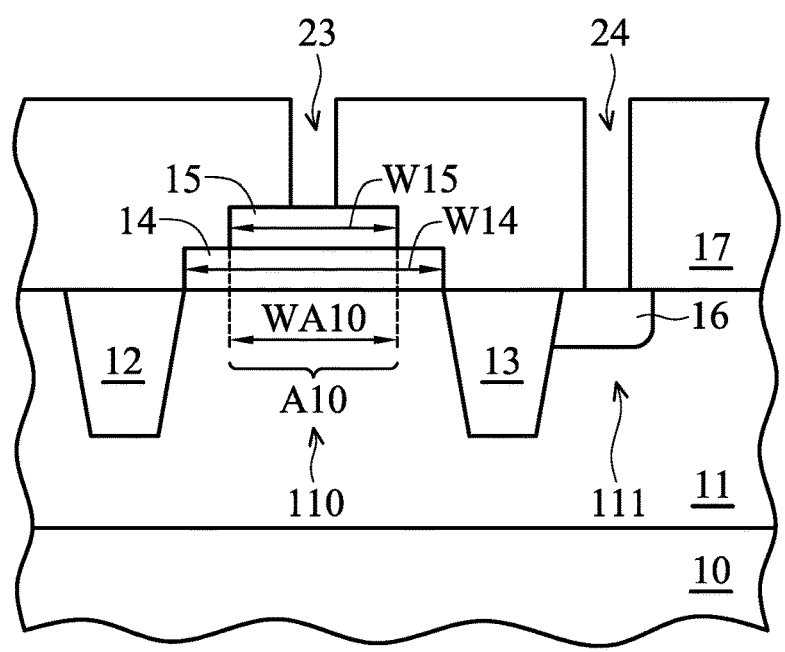
Figure 4F:
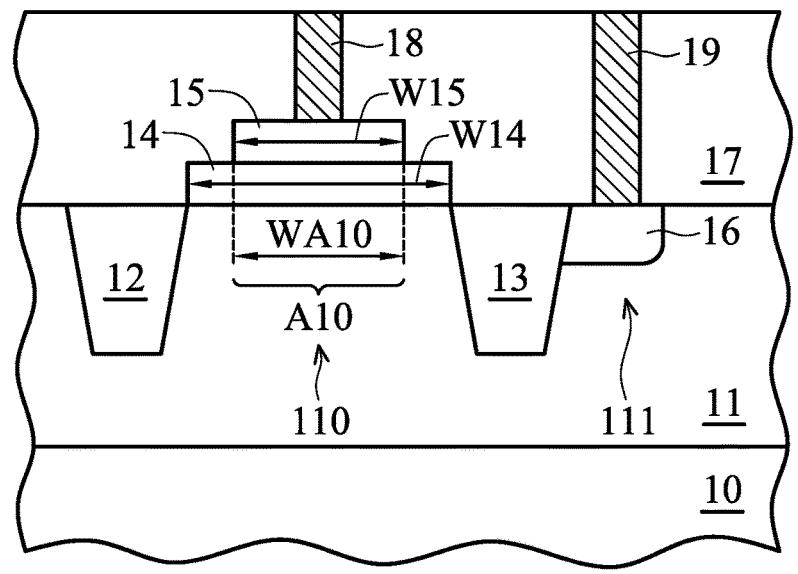
Figure 4G:
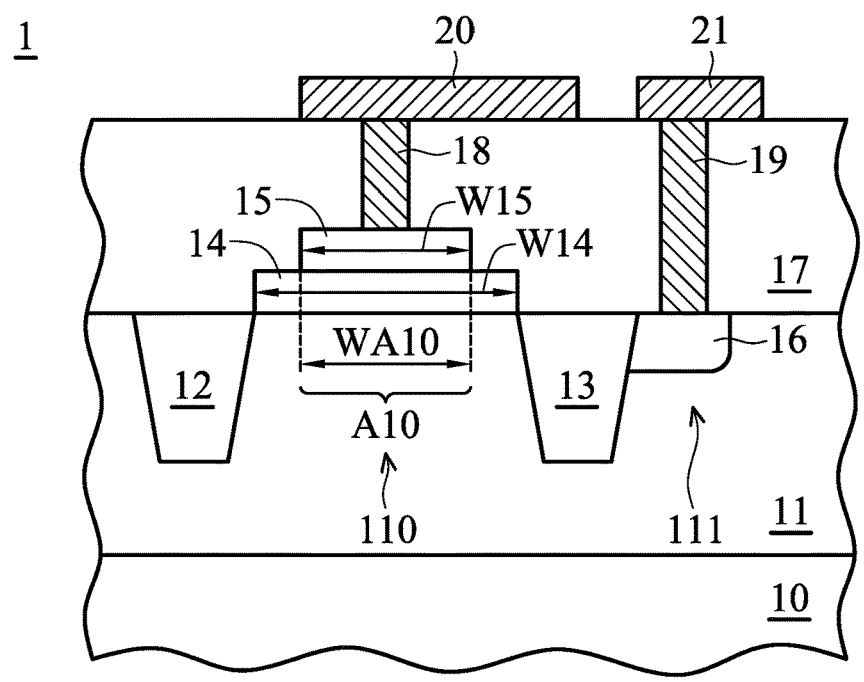

Referring to FIG. 4E, a through hole 23 is formed by etching the insulating layer 17 downward from the position corresponding to the effective capacitance area A10 on the plane surface of the insulating layer 17. Depending on the height of the through hole 23, the through hole 23 may stop at the upper surface of the conductive layer 15 or may enter a portion of the conductive layer 15. In this embodiment, the entirety of the through hole 23 is formed directly on the effective capacitance area A10 of the capacitor. In addition, a through hole 24 is formed by etching the insulating layer 17 downward from the position corresponding to the doped region 16 on the plane surface of the insulating layer 17. Depending on the height of the through hole, the through hole 24 may stop at the upper surface of the doped region 16 or may enter a portion of the doped region 16. As shown in FIG. 4F, the contact vias 18 and 19 are formed by depositing metals in the through holes 23 and 24 respectively. According to the position and height of the through hole 23, the contact via 18 is formed in a portion of the insulating layer 17 on the effective capacitance area A10 and is electrically connected to the conductive layer 15. According to the position and height of the through hole 24, the contact via 19 is formed in a portion of the insulating layer 17 on the doped region 16 and is electrically connected to the doped region 16. Referring to FIG. 4G, after the contact via 18 is formed, a metal layer 20 is formed on one portion of the insulating layer 17. The metal layer 20 covers the contact via 18 and is electrically connected to the contact via 18. Therefore, the conductive layer 15 is electrically connected to the metal layer 20. After the contact via 19 is formed, a metal layer 21 is formed on another portion of the insulating layer 17. The metal layer 21 covers the contact via 19 and is electrically connected to the contact via 19, such that the doped region 16 is electrically connected to the metal layer 21.

According to the above description, the dielectric layer 14, the conductive layer 15, and the doped region 16 form a capacitor structure. The metal layer 20 serves as the upper electrode of the capacitor device, while the metal layer 21 serves as the lower electrode of the capacitor device. The metal layers 20 and 21 may be electrically connected to other devices on the substrate 10. Since the contact via 18 is disposed on the overlapping area between the conductive layer 15 and the dielectric layer 14, the range of the conductive layer 15 that extends from the overlapping area to the one or both sides in the insulating layer 17 may thus be reduced, thereby reducing the size of the semiconductor device 1. As a result, more semiconductor elements or devices can be disposed on the same substrate 10.

The order of the steps in the manufacturing method shown in FIGS. 4A-4G is merely an example and is not intended to limit the present invention. Some of the steps can be advanced or delayed. For example, the doped region 16 (FIG. 4D) may be formed first and then the conductive layer 15 is formed (FIGS. 4B-4C).

The semiconductor device in FIG. 2 may also be formed by a manufacturing method similar to that shown in FIGS. 4A-4G. The differences are the steps of forming the conductive layer 15 and the insulating layer 17 and will be described in the following. The same steps are referred to above, and the related description is omitted herein. Referring to FIG. 2, the width W15 of the conductive layer 15 is equal to the width W14 of the dielectric layer 14. Therefore, in the patterning process of the poly-silicon layer 23 in FIGS. 4B and 4C, the conductive layer 15 is patterned to have a width W15 equal to the width W14 of the dielectric layer 14. In the cases where the width W15 of the conductive layer 15 is equal to the width W14 of the dielectric layer 14, the insulating layer 17 is formed on the doped region 16, the conductive layer 15, and the isolation regions 12 and 13. In detail, the insulating layer 17 contacts the upper surfaces of the doped region 16, the conductive layer 15, and the isolation regions 12 and 13.

The semiconductor device in FIG. 3 may also be formed by a manufacturing method similar to that shown in FIGS. 4A-4G. The differences are the steps of forming the conductive layer 15 and the insulating layer 17 and will be described in the following. The same steps are referred to above, and the related description is omitted herein. Referring to FIG. 3, the width W15 of the conductive layer 15 is greater than the width W14 of the dielectric layer 14. Therefore, in the patterning process of the poly-silicon layer 23 in FIGS. 4B and 4C, the conductive layer 15 is patterned to have a width W15 greater than the width W14 of the dielectric layer 14. In the cases where the width W15 of the conductive layer 15 is greater than the width W14 of the dielectric layer 14, the insulating layer 17 is formed on the doped region 16, the conductive layer 15, and the isolation regions 12 and 13. In detail, the insulating layer 17 contacts the upper surfaces of the doped region 16, the conductive layer 15, and the isolation regions 12 and 13.

Figure 5A:
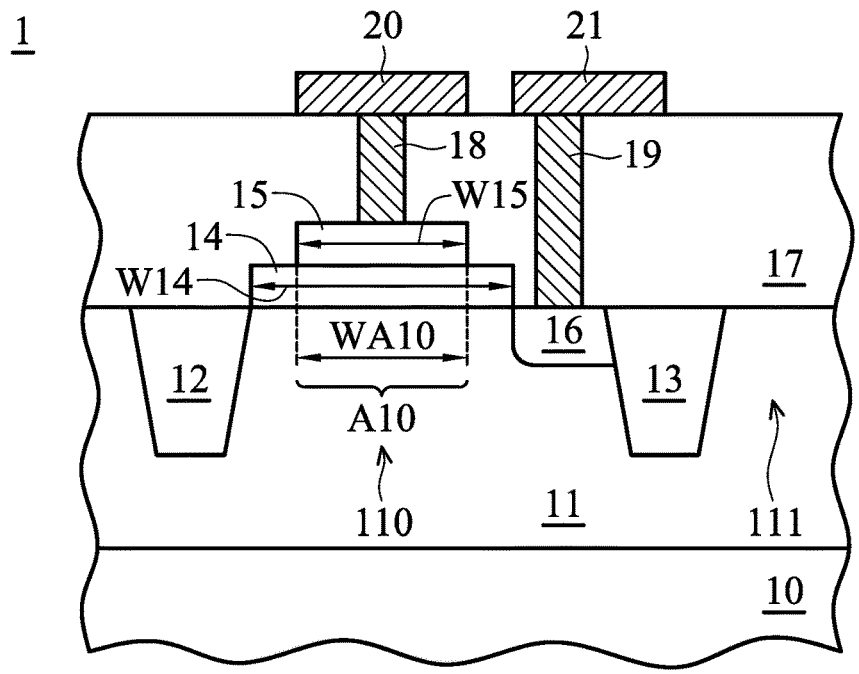
FIGS. 5A-5C are cross-sectional views of semiconductor devices according to some exemplary embodiments.
Figure 5B:
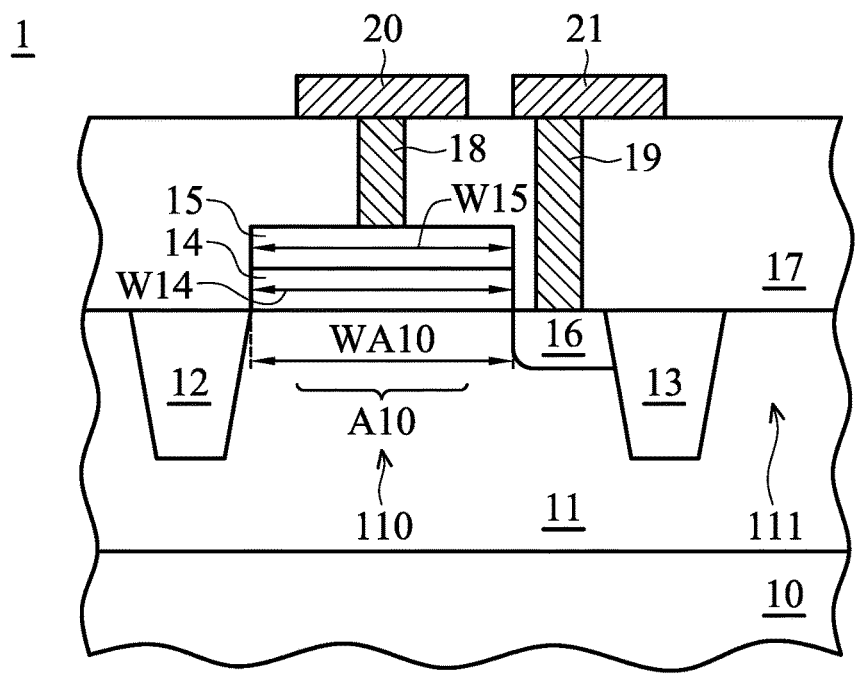
Figure 5C:
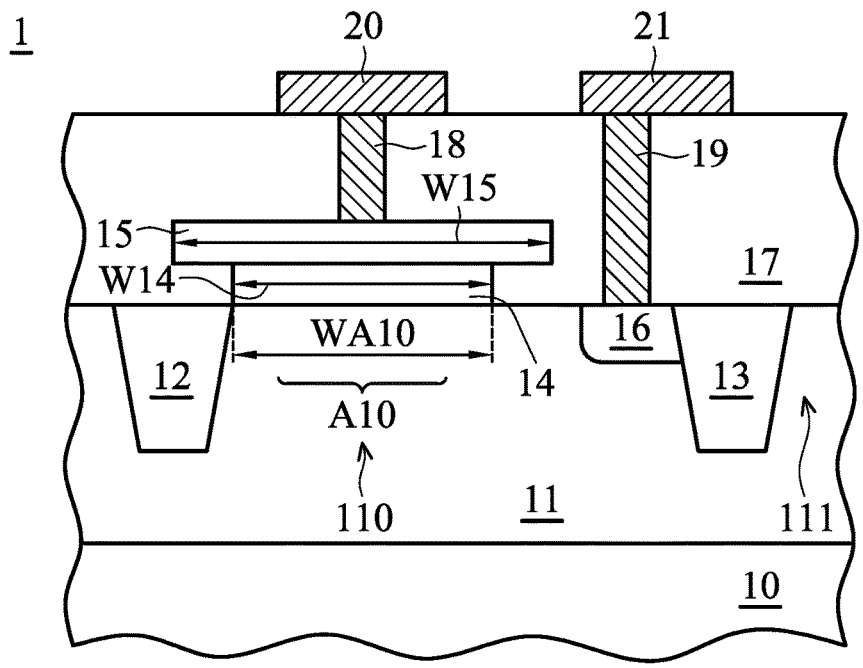

In the embodiment of FIG. 1, the width W14 of the dielectric layer 14 is equal to the width of the upper surface of the area 110. In some embodiments, the dielectric layer 14 formed in the step of FIG. 4B may have a width W14 smaller than the width of the upper surface of the area 110, as shown in FIG. 5A. Referring to FIG. 5A, the doped region 16 may be formed in the area 110 of the well region 11 in the step of FIG. 4D, and the dielectric layer 14 and the doped region 16 do not overlap. Similarly, in the embodiment where the width W15 of the conductive layer 15 is equal to or greater than the width W14 of the dielectric layer 14, the dielectric layer 14 formed in the step of FIG. 4B may have a width W14 smaller than that of the upper surface of the area 110, as shown in FIGS. 5B and 5C. Referring to FIGS. 5B and 5C, the doped region 16 may be formed in the area 110 of the well region 11 in the step of FIG. 4D, and the dielectric layer 14 and the doped region 16 do not overlap.

Figure 6A:
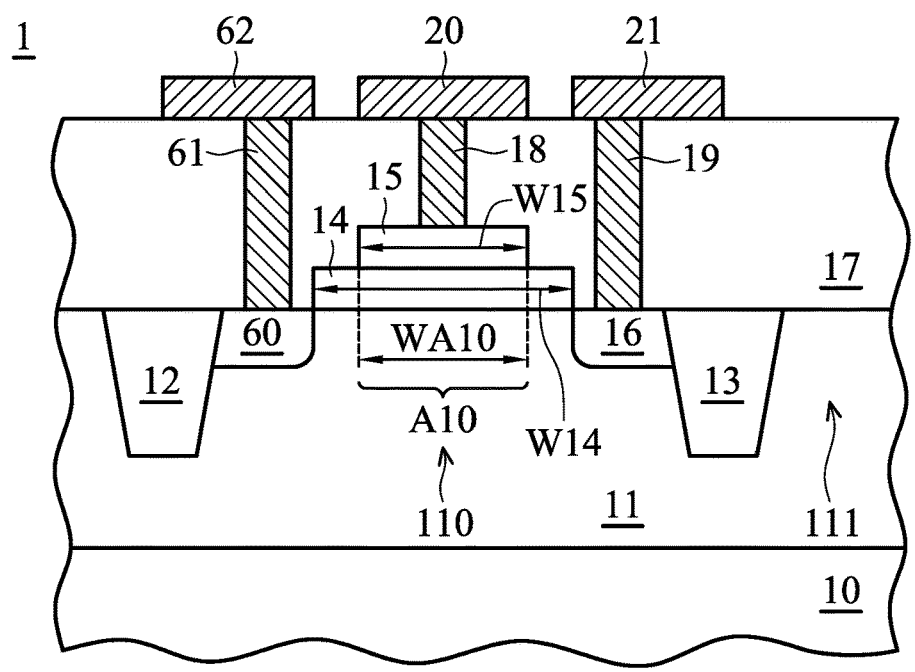
FIGS. 6A-6C are cross-sectional views of semiconductor devices according to other some exemplary embodiments.
Figure 6B:
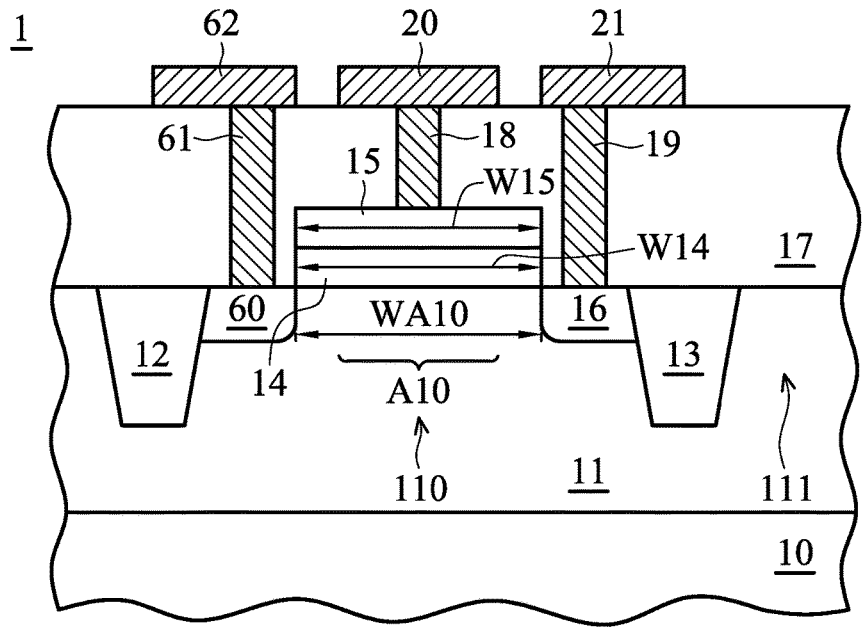
Figure 6C:
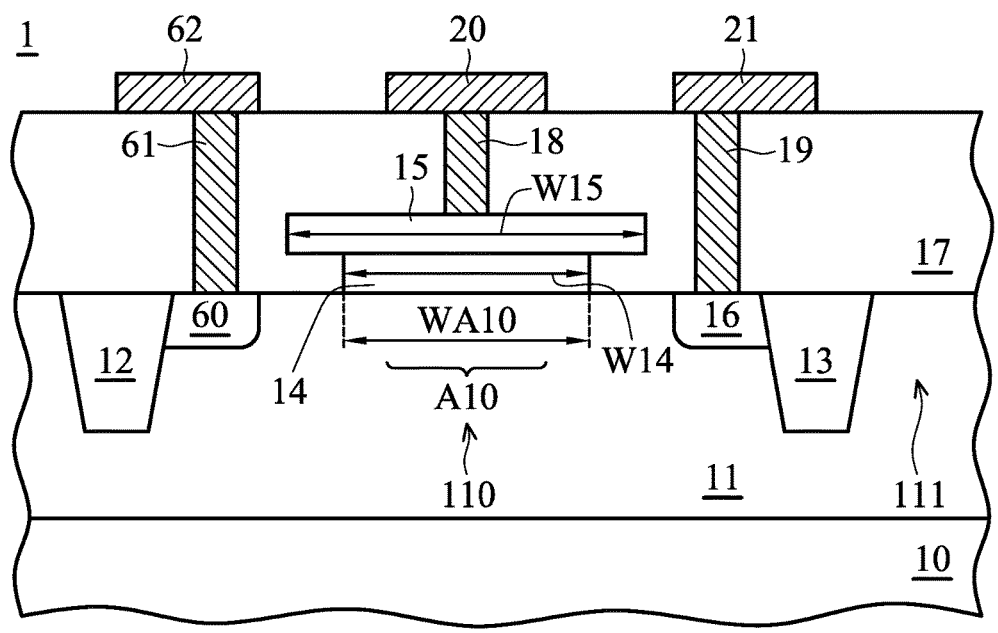

In various embodiments where the width W14 of the dielectric layer 14 is smaller than the width of the upper surface of the area 110, in addition to the formation of the doped region 16 in the area 110 according to the step of FIG. 4D, another doped region 60 is further formed in the area 110, as shown in FIGS. 6A-6C. In FIGS. 6A-6C, the doped region 16 is close to the isolation region 13, while the doped region 60 is close to the isolation region 12. The dielectric layer 14 and the doped region 60 do not overlap. The doped region 60 has the same conductivity type as the well region 11. In this embodiment, the conductivity type of the doped region 60 is P-type. According to the embodiment of FIGS. 6A-6C, in the step of FIG. 4E, an through hole corresponding to the doped layer 60 is formed. Depending on the height of the through hole, the through hole may stop at the upper surface of the doped region 60 or may enter a portion of the doped region 60. A contact via 61 is formed by depositing metals in this through hole. In addition, after the contact via 61 is formed, a metal layer 62 is formed on a portion of the insulating layer 17 in the step of FIG. 4G. The metal layer 62 covers the contact via 61 and is electrically connected to the contact via 61. Therefore, the doped region 60 is electrically connected to the metal layer 62, such that the doped region 60 is electrically connected to the metal layer 21 through the contact via 61 and the metal layer 62.

Figure 7A:
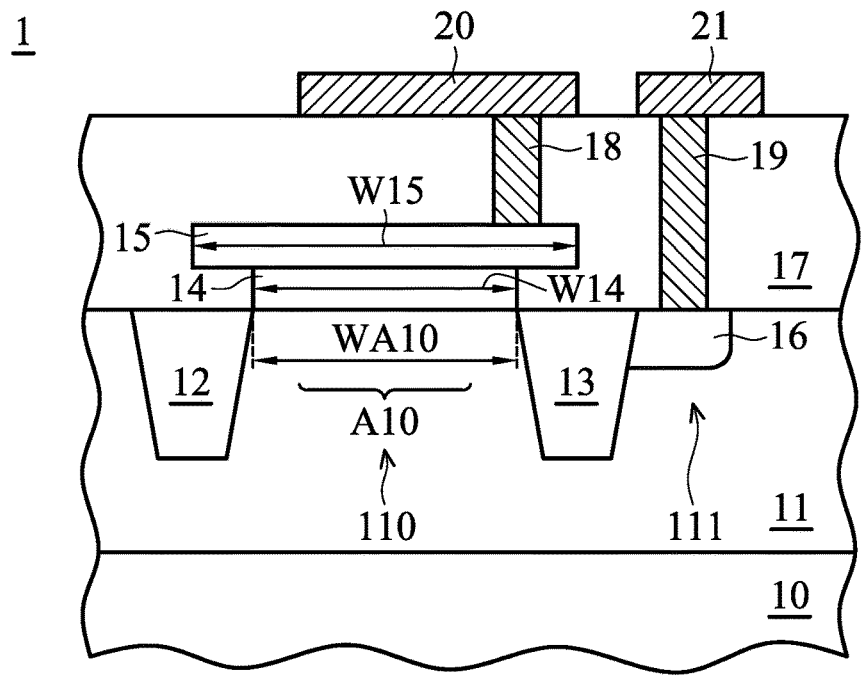
FIGS. 7A-7C are cross-sectional views of semiconductor devices according to other some exemplary embodiments.
Figure 7B:
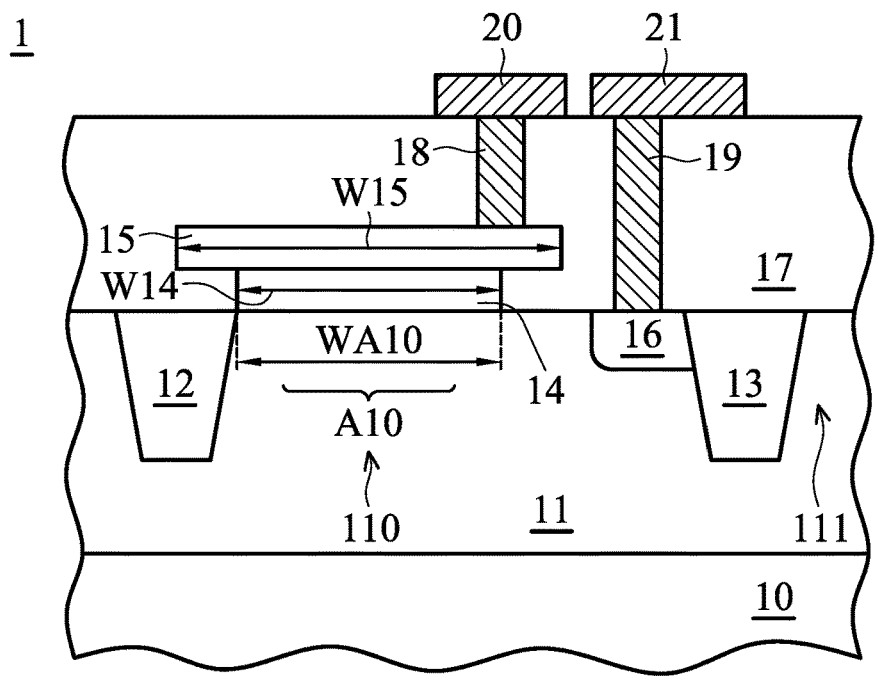
Figure 7C:
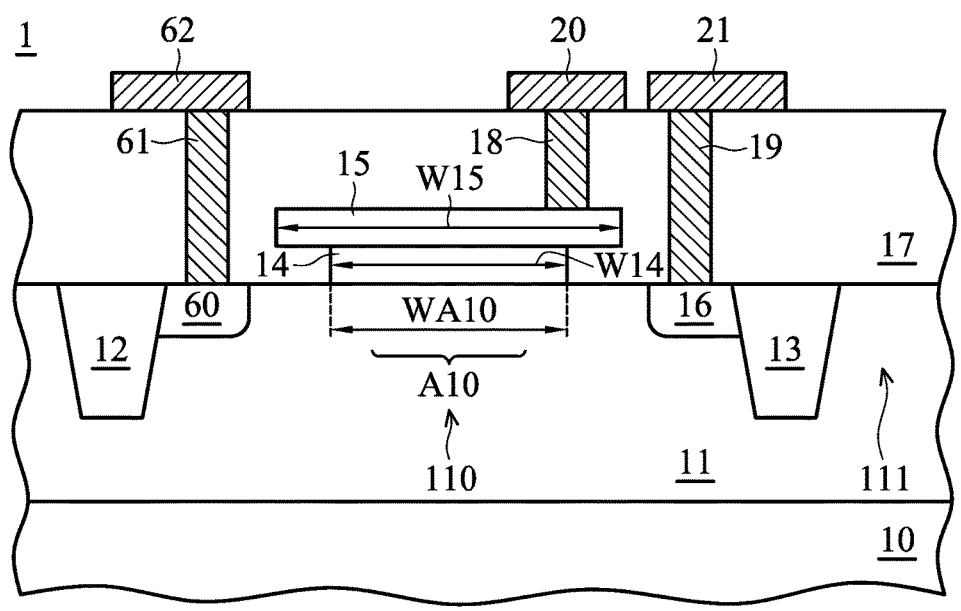

In the above-described embodiments, the entirety of contact via 18 is disposed directly on the overlapping area (effective capacitance area A10) between the conductive layer 15 and the dielectric layer 14. In the embodiment where the width W15 of the conductive layer 15 is greater than the width W14 of the dielectric layer 14, only a portion of the contact via 18 is disposed directly on the overlapping area (the effective capacitance area A10) between the conductive layer 15 and the dielectric layer 14, as shown in FIGS. 7A to 7C.

In the above embodiments, although the semiconductor conductivity type of the substrate 10 of the semiconductor device 1 is P-type. In some embodiments, the semiconductor conductivity type of the substrate 10 may be N type. The structure of a semiconductor device having an N-type substrate may be the same as the structure of the aforementioned semiconductor device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor device, comprising:
    a substrate;
    a well region formed in the substrate;
    a first isolation region and a second isolation region formed in the substrate, wherein the first isolation region is adjacent to the second isolation region;
    a dielectric layer formed on the well region and disposed between the first isolation region and the second isolation region, wherein the dielectric layer does not overlap the first isolation region and the second isolation region;
    a conductive layer forming on the dielectric layer;
    a first doped region formed in the well region and disposed between the first isolation region and the dielectric layer, wherein the first doped region directly contacts the first isolation region;
    an insulating layer formed on the dielectric layer, the first isolation region, the second isolation region, and the first doped region;
    a first contact via formed in the insulating layer and electrically connected to the conductive layer, wherein the first contact via is disposed on an overlapping area between the dielectric layer and the conductive layer; and
    a second contact via formed in the insulating layer and electrically connected to the doped region,
    wherein the well region and the first doped region have the same conductivity type.

2. The semiconductor device as claimed in claim 1, wherein the well region is divided into a first area and a second area according to the first isolation region, and wherein the dielectric layer is formed on the first area of the well region, and the first doped region is formed in the first area of the well region.

3. The semiconductor device as claimed in claim 1, wherein a width of the conductive layer is smaller than a width of the dielectric layer.

4. The semiconductor device as claimed in claim 1, further comprising:
    a second doped region formed in the well region and disposed between the first isolation region and the second isolation region.

5. The semiconductor device as claimed in claim 4, wherein the well region, the first doped region, and the second doped region have the same conductivity type.

6. The semiconductor device as claimed in claim 1, wherein a portion of the first contact via is directly disposed on the overlapping area between the dielectric layer and the conductive layer.

7. The semiconductor device as claimed in claim 6, wherein a width of the conductive layer is greater than a width of the dielectric layer.

8. The semiconductor device as claimed in claim 1, wherein entirety of the first contact via is disposed directly on overlapping area between the dielectric layer and the conductive layer.

9. The semiconductor device as claimed in claim 1, wherein the second isolation region has a top surface, the dielectric layer has a first side wall, and a boundary of the top surface of the second isolation region is aligned to the first side wall.

10. The semiconductor device as claimed in claim 1, wherein the first doped region has a top surface, the dielectric layer has a first side wall, and a boundary of the top surface of the first doped region is aligned to the first side wall of the dielectric layer.

11. A method for manufacturing a semiconductor device, comprising:
    provided a substrate;
    forming a well region in the substrate;
    forming a first isolation region and a second isolation region in the substrate, wherein the first isolation region is adjacent to the second isolation region;
    forming a dielectric layer on the well region between the first isolation region and the second isolation region, wherein the dielectric layer does not overlap the first isolation region and the second isolation region;
    forming a conductive layer on the dielectric layer;
    forming a first doped region in the well region and between the first isolation region and the dielectric layer, wherein the first doped region directly contacts the first isolation region;
    forming an insulating layer on the dielectric layer, the first isolation region, the second isolation region, and the first doped region;
    forming a first contact via in the insulating layer and on an overlapping area between the dielectric layer and the conductive layer, wherein the first contact via is electrically connected to the conductive layer; and
    forming a second contact via in the insulating layer, wherein the second contact via is electrically connected to the doped region,
    wherein the well region and the first doped region have the same conductivity type.

12. The method as claimed in claim 10, wherein the well region is divided into a first area and a second area according to the first isolation region, and wherein the dielectric layer is Ruined on the first area of the well region, and the first doped region is formed in the first area of the well region.

13. The method as claimed in claim 11, wherein a width of the conductive layer is smaller than a width of the dielectric layer.

14. The method as claimed in claim 11, further comprising:
forming a second doped region in the well region between the first isolation region and the second isolation region.

15. The method as claimed in claim 14, wherein the well region, the first doped region, and the second doped region have the same conductivity type.

16. The method as claimed in claim 11, wherein a portion of the first contact via is directly disposed on the overlapping area between the dielectric layer and the conductive layer.

17. The method as claimed in claim 16, wherein a width of the conductive layer is greater than a width of the dielectric layer.

18. The method as claimed in claim 11, wherein entirety of the first contact via is disposed directly on overlapping area between the dielectric layer and the conductive layer.

19. The semiconductor device as claimed in claim 11, wherein the second isolation region has a top surface, the dielectric layer has a first side wall, and a boundary of the top surface of the first isolation region is aligned to the first side wall.

20. The method as claimed in claim 11, wherein the first doped region has a top surface, the dielectric layer has a first side wall, and a boundary of the top surface of the first doped region is aligned to the first side wall of the dielectric layer.

* * * * *